United States Patent
Yoon et al.

(10) Patent No.: US 6,933,096 B2
(45) Date of Patent: Aug. 23, 2005

(54) PHOTOSENSITIVE POLYMER INCLUDING FLUORINE, RESIST COMPOSITION CONTAINING THE SAME AND PATTERNING METHOD USING THE RESIST COMPOSITION

(75) Inventors: Kwang-Sub Yoon, Seoul (KR); Ki-Yong Song, Seoul (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 60 days.

(21) Appl. No.: 10/719,651

(22) Filed: Nov. 21, 2003

(65) Prior Publication Data

US 2004/0157151 A1 Aug. 12, 2004

(30) Foreign Application Priority Data

Nov. 22, 2002 (KR) ................................ 10-2002-0073051

(51) Int. Cl.$^7$ ......................... G03F 7/004; C08F 214/18
(52) U.S. Cl. .................... 430/270.1; 430/326; 430/907; 526/242; 526/271; 526/281; 526/314; 526/244; 526/248; 526/319

(58) Field of Search .............................. 430/270.1, 907, 430/326; 526/242, 271, 281, 314, 244, 248, 319

(56) References Cited

U.S. PATENT DOCUMENTS

2004/0012089 A1 * 1/2004 Rantala et al. .............. 257/750

* cited by examiner

Primary Examiner—Rosemary Ashton
(74) Attorney, Agent, or Firm—F. Chau & Associates, LLC

(57) ABSTRACT

A photosensitive polymer including fluorine, a resist composition containing the same and a patterning method for IC fabrication using the resist composition are provided. The photosensitive polymer having at least one selected from the group consisting of fluorine-substituted or unsubstituted alkyl ester, tetrahydropyranyl ester, tetrahydrofuranyl ester, nitrile, amide, carbonyl and hexafluoro alkyl having a hydrophilic group, and a trifluorovinyl derivative monomer as a repeating unit and having a weight average molecular weight of about 3,000 to about 100,000. The photosensitive polymer exhibits high transmittance for a light source of $F_2$ (157 nm), high dry etching resistance, and has characteristics suitable to realize an unitrafine pattern size.

8 Claims, No Drawings

PHOTOSENSITIVE POLYMER INCLUDING FLUORINE, RESIST COMPOSITION CONTAINING THE SAME AND PATTERNING METHOD USING THE RESIST COMPOSITION

CROSS-REFERENCE TO RELATED APPLICATION

This application claims priority to Korean Patent Application No. 2002-73051, filed on Nov. 22, 2002, which is incorporated herein by reference.

BACKGROUND

1. Technical Field

The present invention relates generally to photosensitive polymers, more particularly to photosensitive polymers including fluorine, a resist composition containing the same and a patterning method using the resist composition.

2. Discussion of the Related Art

As semiconductor devices become more highly integrated and the manufacture of semiconductor devices becomes more complex, the ability to form fine patterns becomes more important. For instance, in semiconductor devices having a memory capacity of 1-gigabit or greater, a pattern size having a design rule of 0.1 μm or less is needed. Such pattern size is difficult to achieve using a conventional photoresist material and a KrF excimer laser (248 nm). A photolithography technique using ArF excimer laser (193 nm) as a new exposure light source has been proposed. The 193 nm photolithography technique can be applied to 0.1 μm level industry. To form still smaller patterns, a new photolithography technique to form patterns having a design rule of 0.1 or less is needed.

Further, the use of a $F_2$ excimer laser (157 nm) applicable to 70 nm level photolithography technique has increased and new resist materials to use the $F_2$ excimer laser (157 nm) have been proposed.

Resist materials used in the lithography using $F_2$ (157 nm) excimer laser are required to meet several criteria, e.g., high transmittance for a light source of 157 nm or below, high dry etching resistance, good adhesion to underlying layers, high contrast, and capable of being developed using a conventional developer.

Polymers having the following formulas have been proposed as resist materials for 157 nm laser as follows:

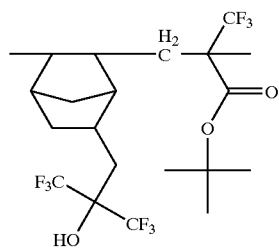

[Formula 1]

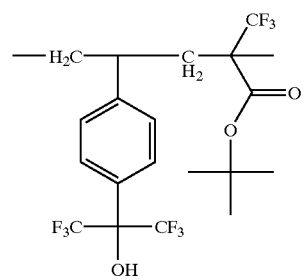

[Formula 2]

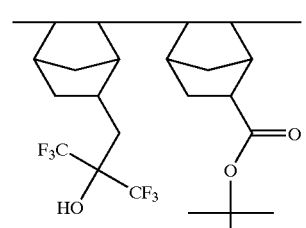

[Formula 3]

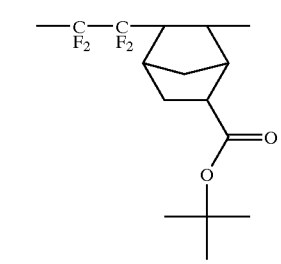

[Formula 4]

Polymers using tetrafluoroethylene ($CF_2CF_2$) monomer, as represented by Formula 4, exhibit very low absorbance to a wavelength of 157 nm and proposed as resist materials suitable for 157 nm lithography, which is described in Journal of photopolymer science and technology, Vol. 14, No. 4, pp 583–593, 2001 and Journal of photopolymer science and technology, Vol. 14, No. 4, pp 669–674, 2001.

Another polymer containing greater than 50% fluorine having a high transmittance at 157 nm, as represented by Formula 5, has been proposed, as described in "157 nm single layer resists based on advanced fluorinated polymers" Proc. SPIE 2002:

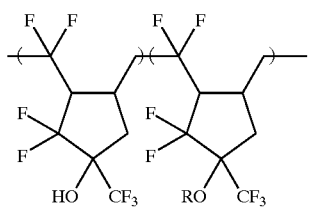

[Formula 5]

However, photosensitive polymers have not satisfied the various requirements needed to be used as resist materials for $F_2$ excimer laser, Therefore, a need exists for photosensitive polymers having a high transmittance for F2 excimer (157nm) laser, a resist composition comprising the same for use in a shorter wavelength exposure light source of 157 nm or below, and pattern methods using the same.

SUMMARY OF THE INVENTION

Provided is a photosensitive polymer having high transmittance for $F_2$ excimer (157 nm) laser and having characteristics suitable to realize an ultra-fine pattern size.

Also provided is a resist composition comprising a photosensitive polymer and suitably used for a shorter wavelength exposure light source of 157 nm or below.

Further, provided is a pattern method using a resist composition comprising a photosensitive polymer and suitably used for a shorter wavelength exposure light source of 157 nm or below.

According to one exemplary embodiment of the present invention, there is provided a photosensitive polymer having a trifluorovinyl derivative monomer.

The photosensitive polymer includes at least one selected from the group consisting of fluorine-substituted or unsubstituted alkyl ester, tetrahydropyranyl ester, tetrahydrofuranyl ester, nitrile, amide, carbonyl or hexafluoro alkyl having a hydrophilic group, and a trifluorovinyl derivative monomer as a repeating unit.

According to another exemplary embodiment, the photosensitive polymer is a polymerization product of the trifluorovinyl derivative monomer and at least one monomer selected from the group consisting of a fluorine-substituted or unsubstituted (meth)acrylic acid monomer, (meth)acrylate monomer, styrene monomer, norbornene monomer, tetrafluoroethylene monomer and maleic anhydride monomer.

According to yet another exemplary embodiment, there is provided a resist composition comprising one of the photosensitive polymers discussed in the above exemplary embodiments and a photoacid generator (PAG) in an amount of about 0.01 to about 2.0% by weight based on the total weight of the photosensitive polymer.

The resist composition may further comprise an organic base in an amount of about 0.01 to about 2.0% by weight based on the total weight of the photosensitive polymer.

According to still another exemplary embodiment of the present invention, there is provided a patterning method comprising coating a resist composition of the present invention on a substrate to form a resist layer, exposing the resist layer using an exposure light source having a wavelength of 157 nm or below, and developing the exposed resist layer to form a resist pattern.

DETAILED DESCRIPTION OF EXEMPLARY EMBODIMENTS

A photosensitive polymer according to the present invention, a resist composition containing the same and a patterning method using the resist composition will now be described. The present invention is not limited to the following exemplary embodiments but is embodied in various manners. These exemplary embodiments are provided only for perfecting the disclosure of the invention and for making one having the ordinary skill in the art thoroughly understand the scope of the invention. In addition, throughout the following formulas, the same letter denotes the same substituent.

A photosensitive polymer according to an exemplary embodiment of the present invention includes a trifluorovinyl derivative monomer represented by Formula 6:

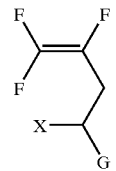

[Formula 6]

wherein X is a $C_1$–$C_5$ alkyl group with or without a fluorine substituent, and G is at least one selected from the group consisting of the following substituents:

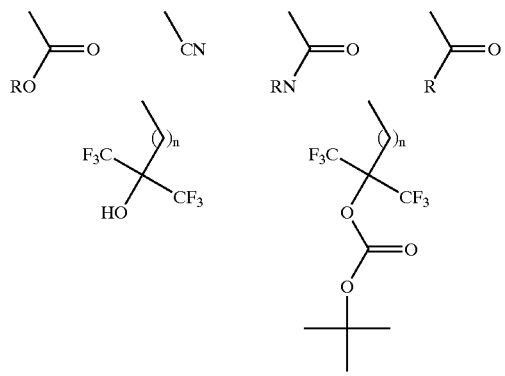

wherein R is a primary, secondary or tertiary $C_1$–$C_{10}$ alkyl, tetrahydropyranyl, tetrahydrofuranyl or 1-ethoxyethyl group, and n is an integer from 1 to 5.

Preferably, the tertiary $C_1$–$C_{10}$ alkyl group is a t-butyl group, a t-amyl group, a 1,1-diethylpropyl group, a 1-ethylcyclopentyl group and a 1-ethyl-2-cyclopentenyl group.

The photosensitive polymer has a weight average molecular weight of about 3,000 to about 100,000.

According to another exemplary embodiment of the present invention, a photosensitive polymer is a polymer formed by polymerizing at least one monomer selected from the group consisting of a (meth)acrylic acid monomer, a (meth)acrylate monomer, a styrene monomer, a tetrafluoroethylene monomer and a maleic anhydride monomer with the trifluorovinyl derivative monomer. As the monomer participating in polymerization, a monomer having a fluorine substituent is advantageously used in view of transmittance.

As represented by Formulas 7 through 11, trifluoromethyl acrylic acid, 2,2,2-trifluoro-1-trifluoromethyl ethyl acrylate, t-butyl trifluoromethyl acrylate, styrene with hexafluoroisopropanol substituent, or 3-norbornylmethyl-2-t-butyloxycarbonyloxy-1,1,1-trifluoro-2-trifluoromethyl propane is suitably used for improving characteristics of a photosensitive polymer for $F_2$ excimer laser:

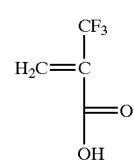

[Formula 7]

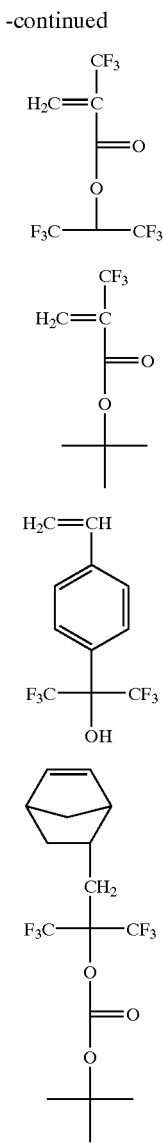

[Formula 8]

[Formula 9]

[Formula 10]

[Formula 11]

The photosensitive polymers according to the present invention can be obtained by general radical polymerization by mixing the monomers. Also, bulk polymerization or solution polymerization can be used. Preferably, polymerization initiators include radical initiators such as azobisisobutyronitrile (AIBN). For solution polymerization, solvents exemplified by tetrahydrofuran (THF), dioxane, ethylacetate, dichloromethane and cyclohexane can be used. The molar ratio of monomers can be adjusted according to characteristics of resist materials.

According to another exemplary embodiment of the present invention, a resist composition is prepared as follows. First, one of the photosensitive polymers discussed in the above exemplary embodiments and a PAG are dissolved in various types of solvents such as propylene glycol monomethyl ether acetate (PGMEA), ethyl lactate or cyclohexanone, to prepare a resist solution.

The PAG is preferably used in an amount of about 1 to about 15% by weight based on the total weight of the photosensitive polymer. The PAG comprises triarylsulfonium salts, diaryliodonium salts, sulfonates or mixtures thereof.

Preferably, the PAG includes triphenylsulfonium triflate, triphenylsulfonium antimonate, triphenylsulfonium nonaflate, triphenylsulfonium perfluorooctane sulfonate, diphenyliodonium triflate, methoxydiphenyliodonium triflate, di-t-butyldiphenyliodonium triflate, diphenyliodonium antimonate, diphenyliodonium nonaflate, methoxydiphenyliodonium nonaflate, di-t-butyidiphenyliodonium nonaflate, diphenyliodonium perfluorooctane sulfonate, methoxydiphenyliodonium perfluorooctane sulfonate, 2,6-dinitrobenzyl sulfonate, pyrogallol tris(alkylsulfonate), N-hydroxysuccine imide triflate, N-hydroxysuccine imide nonaflate, N-hydroxysuccine imide perfluorooctane sulfonate, norbornene dicarboxyimide triflate, norbornene dicarboxyimide nonaflate, norbornene dicarboxyimide perfluorooctane sulfonate or mixtures thereof.

Preferably, an organic base is contained in an amount of about 0.01 to about 2.0% by weight based on the total weight of the photosensitive polymer, and may be an organic ternary amine exemplified by triethylamine, triisobutylamine, triisooctylamine, triisodecylamine, diethanolamine, triethanolamine, or any mixture thereof. The organic base is added for the purpose of preventing pattern deformation by acidolysis of a resist composition forming a non-exposure portion after exposure, which is caused when acid generated at an exposure portion is diffused into the non-exposure portion.

In addition, about 30 to about 200 ppm of an organic surfactant or salt surfactant may be further added to prepare the resist composition for the purpose of allowing the resist composition to be uniformly coated on a substrate.

To regulate the overall dissolution speed, a dissolution inhibitor may also be added in an amount of about 0.1 to about 50% by weight based on the total weight of the photosensitive polymer.

To perform a photolithography process, a resist solution is filtered twice using a 0.2 μm membrane filter to prepare a resist composition. A patterning process is performed using the prepared resist composition as follows.

The resist composition is coated on a substrate to be patterned or a substrate where a layer to be patterned is formed (hereinafter both will be referred to as a substrate), thereby forming a resist layer having a predetermined thickness. Preferably, the thickness of the resist layer is in a range of about 0.05 to about 0.5 μm. The resist composition according to the present invention has good adhesion, which improves coating of the resist layer. Then, the resist layer is soft-baked. Soft-baking is performed at temperature in a range of about 80° C. to about 150° C. for about 30 to about 300 seconds. Next, the resist layer is exposed using a mask having a predetermined pattern. An exposure light source using a wavelength of 193 nm or below, preferably, $F_2$ excimer laser (157 nm), is used as an exposure light source. The Exposure generates acid from a PAG contained in the resist layer.

After exposure, a post-exposure bake (PEB) is performed. The PEB produces a large amount of hydrophilic groups in the exposed resist layer by hydrolyzing a photosensitive polymer in the presence of acid generated at during the exposure process as a catalyst. Thus, a noticeable difference in polarity between the exposed resist layer and the unexposed resist layer is created. Subsequently, a development process is performed using an appropriate developer, thereby forming a photoresist pattern having a pattern profile with high resolution. For example, a solution of 2.38 wt % trimethylammonium hydroxide (TMAH) is used as the developer. The photoresist pattern is used as an etching mask to etch the substrate or the layer to be pattern to form a desired pattern.

Reagents used in the present invention are commercially available, for example, from Aldrich Chemical Co.

Synthesis of Monomer

SYNTHESIS EXAMPLE 1-a

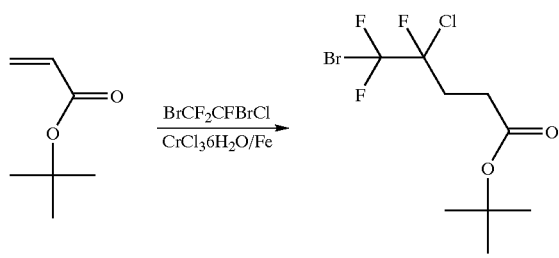

5.5 g of Fe powder, 2.3 g of chlorochromium hexahydrate (CrCl$_3$.6H$_2$O), 12.8 g of acrylic acid t-butyl ester and 40 g of 1-chloro-1,2-dibromo-1,2,2-trifluoroethane were dissolved in 200 mL tetrahydropyran, followed by stirring at about 60° C. for about 20 hours.

Thereafter, the reactant was poured into 200 mL water, filtered and washed with 200 mL ether. An aqueous solution layer was extracted twice with 300 mL ether and an organic layer was dried using MgSO$_4$. Then, the solvent was distilled under reduced pressure, yielding about 32 g of 5-bromo-4-chloro-4,5,5-trifluoro-pentanoic acid t-butyl ester.

SYNTHESIS EXAMPLE 1-b

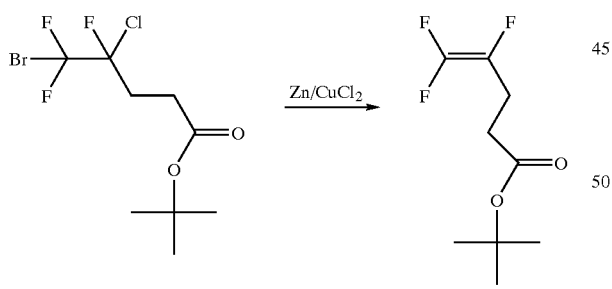

6.5 g of Zn powder, 1 g of CuCl$_2$ and 32 g of the resultant product synthesized in Synthesis Example 1-a were dissolved in 200 mL N,N-dimethylformamide (DMF), followed by stirring at room temperature for about 1 hour. 5% HCl was added to the reactant, extracted twice with 200 mL ether, and then washed with a NaHCO$_3$ solution and a NaCl solution. An organic layer was dried with MgSO$_4$, and the solvent was distilled under reduced pressure, giving about 24 g of 4,5,5-trifluoro-pent-4-enoic acid t-butyl ester.

SYNTHESIS EXAMPLE 2

SYNTHESIS EXAMPLE 2-a

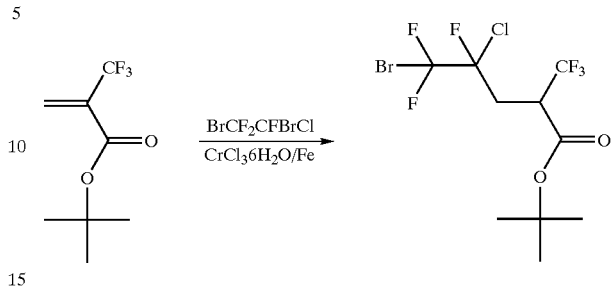

The same procedure as in Synthesis Example 1-a was carried out except that 2-trifluoromethyl-acrylic acid t-butyl ester was used instead of acrylic acid t-butyl ester, thereby obtaining 5-bromo-4-chloro-4,5,5-trifluoro-2-trifluoromethyl-pent-4-enoic acid t-butyl ester with a yield of about 84%.

SYNTHESIS EXAMPLE 2-b

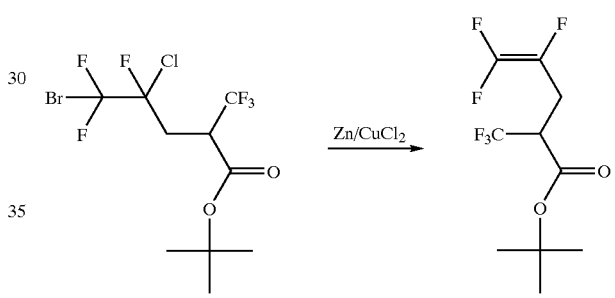

The same procedure as in Synthesis Example 1-b was carried out except that 5-bromo-4-chloro-4,5,5-trifluoro-2-trifluoromethyl-pentanoic acid t-butyl ester prepared in Synthesis Example 2-a was used, thereby obtaining 4,5,5-trifluoro-2-trifluoromethyl-4-pent-4-enoic acid t-butyl ester with a yield of about 77%.

SYNTHESIS EXAMPLE 3

SYNTHESIS EXAMPLE 3-a

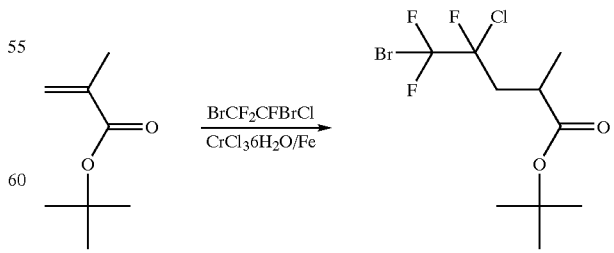

The same procedure as in Synthesis Example 1-a was carried out except that 2-methyl-acrylic acid t-butyl ester was used instead of acrylic acid t-butyl ester, thereby obtaining 5-bromo-4-chloro-4,5,5-trifluoro-2-methyl-pentanic t-butyl ester with a yield of about 80%.

SYNTHESIS EXAMPLE 3-b

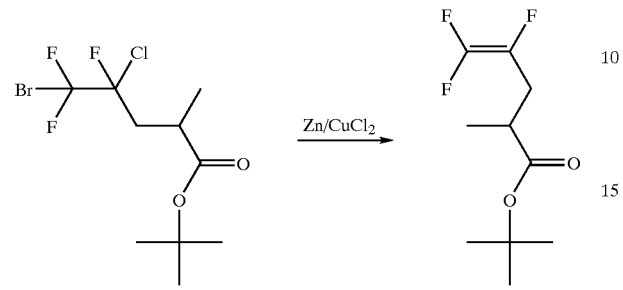

The same procedure as in Synthesis Example 1-b was carried out except that 5-bromo-4-chloro-4,5,5-trifluoro-2-methyl-pentanic t-butyl ester prepared in Synthesis Example 3-a was used, thereby obtaining 4,5,5-trifluoro-2-methyl-pent-4-enoic acid t-butyl ester with a yield of about 82%.

SYNTHESIS EXAMPLE 4

SYNTHESIS EXAMPLE 4-a

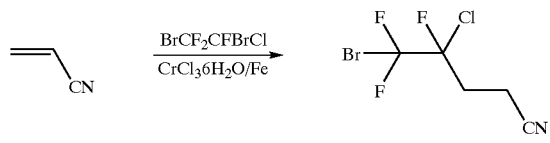

The same procedure as in Synthesis Example 1-a was carried out except that acrylonitrile was used instead of acrylic acid t-butyl ester, thereby obtaining 5-bromo-4-chloro-4,5,5-trifluoropentane nitrile with a yield of about 75%.

SYNTHESIS EXAMPLE 4-b

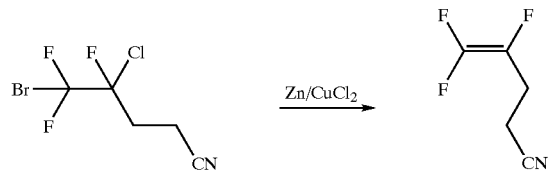

The same procedure as in Synthesis Example 1-b was carried out except that 5-bromo-4-chloro-4,5,5-trifluoropentane nitrile prepared in Synthesis Example 4-a was used, thereby obtaining 4,5,5-trifluoro-4-pentene nitrile with a yield of about 76%.

Synthesis of Polymer

SYNTHESIS EXAMPLE 1

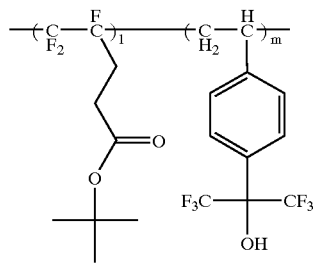

2.1 g of 4,5,5-trifluoro-4-pentenic acid t-butyl ester synthesized from the monomer synthesized in Synthesis Example 1-b, 2.7 g of 1,1,1,3,3,3-hexafluoro-2-(4-vinyl-phenyl)-propane-2-ol and 0.16 g of AIBN (azobisisobutyronitrile) were reacted at about 65° C. for about 24 hours. Thereafter, the reactant was slowly precipitated twice in excess hexane and filtered. The filtrate was dried in a vacuum oven for about 24 hours to give 3.65 g of a copolymer with a yield of about 76%.

The resultant copolymer had a weight average molecular weight (Mw) of about 35,000 and a polydispersity (Mw/Mn) of about 2.5.

SYNTHESIS EXAMPLE 2

The same procedure as in Synthesis Example 1 was carried out except that 4,5,5-trifluoro-2-trifluiromethyl-pent-4-enoic acid t-butyl ester was used instead of 4,5,5-trifluoro-pent-4-enoic acid t-butyl ester, thereby obtaining a copolymer with a yield of about 71%.

The resultant copolymer had a weight average molecular weight (Mw) of about 32,000 and a polydispersity (Mw/Mn) of about 2.4.

SYNTHESIS EXAMPLE 3

The same procedure as in Synthesis Example 1 was carried out except that 4,5,5-trifluoro-2-methyl-pent-4-enoic acid t-butyl ester was used instead of 4,5,5-trifluoro-pent-4-enoic acid t-butyl ester, thereby obtaining a copolymer with a yield of about 75%.

The resultant copolymer had a weight average molecular weight (Mw) of about 29,000 and a polydispersity (Mw/Mn) of about 2.1.

SYNTHESIS EXAMPLE 4

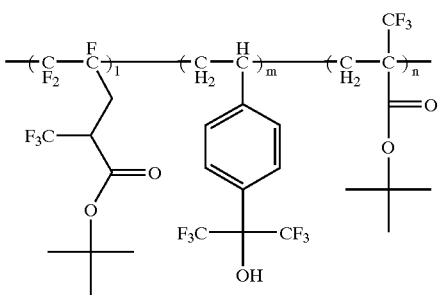

2.1 g of 4,5,5-trifluoro-2-trifluoromethyl-pent4-enoic acid t-butyl ester, 2.7 g of 1,1,1,3,3,3-hexafluoro-2-(4-vinylphenyl)-propane-2-ol, 0.5 g of 2-trifluoromethyl acrylic acid t-butyl ester and 0.16 g of AIBN were reacted at about 65° C. for about 24 hours. The reactant was precipitated twice in excess hexane and filtered. The filtrate was dried in a vacuum oven for about 24 hours to give a terpolymer with a yield of about 71%.

The resultant terpolymer had a weight average molecular weight (Mw) of about 32,000 and a polydispersity (Mw/Mn) of about 2.6.

SYNTHESIS EXAMPLE 5

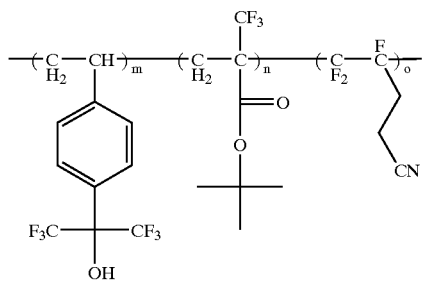

2.7 g of 1,1,1,3,3,3-hexafluoro-2-(4-vinyl-phenyl)-propane-2-ol, 1 g of 2-trifluoromethyl-acrylic acid t-butyl ester, 0.67 g of 4,5,5-trifluoro-4-pentene nitrile and 0.16 g of AIBN were reacted at about 65° C. for about 24 hours. The resultant product was precipitated twice in excess hexane and filtered. The filtrate was dried in a vacuum oven for about 24 hours to give a terpolymer with a yield of about 65%.

The resultant terpolymer had a weight average molecular weight (Mw) of about 26,000 and a polydispersity (Mw/Mn) of about 2.7.

SYNTHESIS EXAMPLE 6

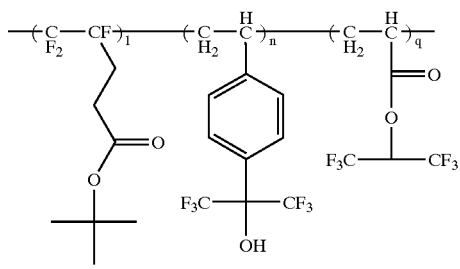

2.1 g of 4,5,5-trifluoro-pent-4-enoic acid t-butyl ester, 2.7 g of 1,1,1,3,3,3-hexafluoro-2-(4-vinyl-phenyl)-propane-2-ol, 1.1 g of acrylic-2,2,2-trifluoro-1-trifluoromethyl-ethyl ester and 0.25 g of AIBN were reacted at about 65° C. for about 24 hours. The resultant product was precipitated twice in excess hexane and filtered. The filtrate was dried in a vacuum oven for about 24 hours to give a terpolymer with a yield of about 75%.

The resultant terpolymer had a weight average molecular weight (Mw) of about 31,000 and a polydispersity (Mw/Mn) of about 2.3.

SYNTHESIS EXAMPLE 7

The same procedure as in Synthesis Example 6 was carried out except that 4,5,5-trifluoro-2-trifluoromethyl-pent-4-enoic acid t-butyl ester was used instead of 4,5,5-trifluoro-pent-4-enoic acid t-butyl ester, thereby obtaining a terpolymer with a yield of about 74%.

The resultant terpolymer had a weight average molecular weight (Mw) of about 38,000 and a polydispersity (Mw/Mn) of about 2.7.

SYNTHESIS EXAMPLE 8

The same procedure as in Synthesis Example 1 was carried out except that 4,5,5-trifluoro-2-methyl-pent-4-enoic acid t-butyl ester was used instead of 4,5,5-trifluoro-pent-4-enoic acid t-butyl ester, thereby obtaining a polymer with a yield of about 75%.

The resultant polymer had a weight average molecular weight (Mw) of about 31,000 and a polydispersity (Mw/Mn) of about 2.3.

Preparation of Resist Composition and Patterning Process 1.0 g of each of the polymers synthesized in Synthesis Examples 1 through 8 was completely dissolved in 15 g of a solution of cyclohexanone together with 0.05 g of triphenylsulfonium triflate as a photoacid generator (PAG) and 5 mg of triisodecylamine as an organic base, followed by filtering using a 0.2 μm membrane filter, thereby preparing resist compositions.

Each of the resist compositions was coated to a thickness of about 0.15 μm on a silicon wafer with an organic antireflective layer.

Thereafter, the wafer was soft-baked at a temperature of about 100° C. to about 140° C. for about 60 seconds, exposed using an $F_2$ excimer laser stepper (NA=0.6) and then subjected to post-exposure bake (PEB) at a temperature of about 110° C. to about 140° C. for about 60 seconds.

Thereafter, the resultant wafer was developed with a solution of TMAH (2.38 wt %) for about 30 seconds to form a resist pattern.

Thus, about 0.08 to about 0.23 μm lines and spaces pattern were obtained at an exposure dose of about 5 to 50 mJ/cm². In particular, a 0.1 μm lines and spaces pattern with high resolution was also obtained.

A trifluorovinyl derivative which is a monomer forming the photosensitive polymer according to the present invention includes a plurality of fluorine substituent, like tetrafluoroethane that has been conventionally widely used in synthesis of photosensitive polymers for $F_2$ excimer laser. Also, since the trifluorovinyl derivative has a substituent of alkyl ester, tetrahydropyranyl ester, tetrahydrofuranyl ester, nitrile, amide, carbonyl or hexafluoro alkyl having a hydrophilic group, adhesion and hydrophilicity can be enhanced. In particular, in the case of including an acid-labile alkyl group, e.g., t-butyl, contrast can be increased.

Further, a photosensitive polymer according to the present invention has a suitable glass transition temperature in a range of about 120° C. to about 180° C. Since the resist layer prepared from the photosensitive polymer according to the present invention has a reduced free volume therein by a sufficient annealing effect during baking, the resist layer is stable against the ambience even during post-exposure delay. Thus, when the resist composition according to the present invention is applied to photolithography, it exhibits high performance, so that it can be used in manufacturing next-generation semiconductor devices.

What is claimed is:

1. A photosensitive polymer having a trifluorovinyl derivative monomer as a repeating unit and having a weight average molecular weight of about 3,000 to about 100,000, the trifluorovinyl derivative represented by the following formula:

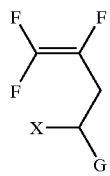

wherein X is a $C_1$–$C_5$ alkyl group with or without fluorine substituent, and G is at least one selected from the group consisting of:

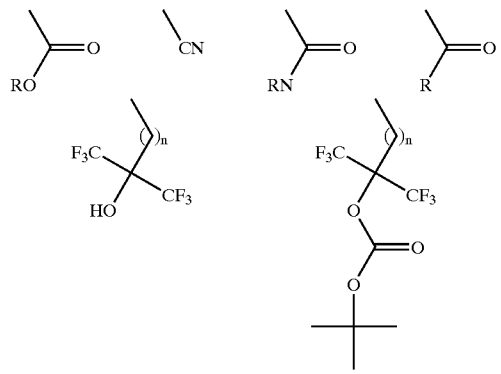

wherein R is a primary, secondary or tertiary $C_1$–$C_{10}$ alkyl, tetrahydropyranyl, tetrahydrofuranyl or 1-ethoxyethyl group, and n is an integer from 1 to 5.

2. The photosensitive polymer according to claim 1, wherein the photosensitive polymer is a polymerization product of the trifluorovinyl derivative monomer and at least one monomer selected from the group consisting of a fluorine-substituted or unsubstituted (meth)acrylic acid monomer, (meth)acrylate monomer, styrene monomer, norbornene monomer, tetrafluoroethylene monomer and maleic anhydride monomer.

3. A resist composition comprising:
a photosensitive polymer having a trifluorovinyl derivative monomer as a repeating unit and having a weight average molecular weight of about 3,000 to about 100,000, the trifluorovinyl derivative represented by the following formula:

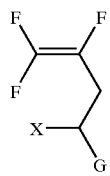

wherein X is a $C_1$–$C_5$ alkyl group with or without fluorine substituent, and G is at least one selected from the group consisting of:

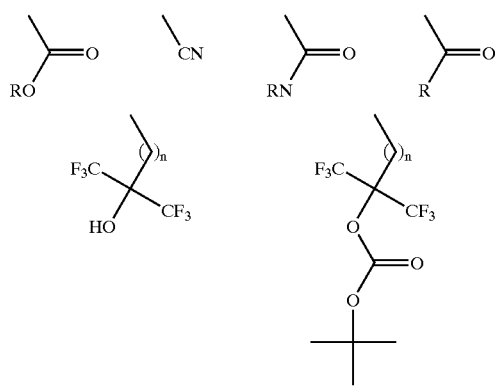

wherein R is a primary, secondary or tertiary $C_1$–$C_{10}$ alkyl, tetrahydropyranyl, tetrahydrofuranyl or 1-ethoxyethyl group, and n is an integer from 1–5; and a photoacid generator in an amount of about 1 to about 15% by weight based on the total weight of the photosensitive polymer.

4. The resist composition according to claim 3, wherein the photosensitive polymer is a polymerization product of the trifluorovinyl derivative monomer and at least one monomer selected from the group consisting of a fluorine-substituted or unsubstituted (meth)acrylic acid monomer, (meth)acrylate monomer, styrene monomer, norbornene monomer, tetrafluoroethylene monomer and maleic anhydride monomer.

5. The resist composition according to claim 3, further comprising an organic base in an amount of about 0.01 to about 2.0% by weight based on the total weight of the photosensitive polymer.

6. A patterning method comprising:
(a) coating a resist composition on a substrate, wherein the resist composition comprises:
a photosensitive polymer having a trifluorovinyl derivative monomer as a repeating unit and having a weight average molecular weight of about 3,000 to about 100,000, the trifluorovinyl derivative represented by the following formula:

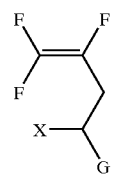

wherein X is a $C_1$–$C_5$ alkyl group with or without fluorine substituent, and G is at least one selected from the group consisting of:

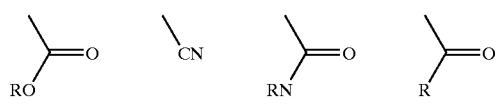

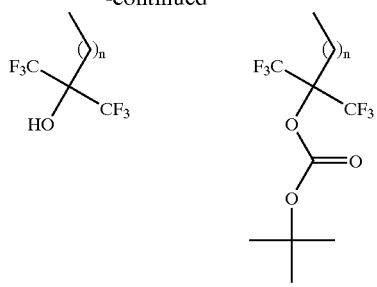

wherein R is a primary, secondary or tertiary $C_1$–$C_{10}$ alkyl, tetrahydropyranyl, tetrahydrofuranyl or 1-ethoxyethyl group, and n is an integer from 1–5; and a photoacid generator in an amount of about 1 to about 15% by weight based on the total weight of the photosensitive polymer;

(b) exposing the resist layer using an exposure light source having a wavelength of 157 nm or less; and (c) developing the exposed resist layer to form a resist pattern.

7. The patterning method of claim 6, wherein the photosensitive polymer is a polymerization product of the trifluorovinyl derivative monomer and at least one monomer selected from the group consisting of a fluorine-substituted or unsubstituted (meth)acrylic acid monomer, (meth)acrylate monomer, styrene monomer, norbornene monomer, tetrafluoroethylene monomer and maleic anhydride monomer.

8. The patterning method of claim 6, wherein the resist composition further comprises an organic base in an amount of about 0.01 to about 2.0% by weight based on the total weight of the photosensitive polymer.

* * * * *